(12) United States Patent
Huang

(10) Patent No.: US 10,084,013 B2
(45) Date of Patent: Sep. 25, 2018

(54) THIN-FILM TRANSISTOR, DISPLAY DEVICE, AND METHOD FOR MANUFACTURING THIN-FILM TRANSISTOR

(71) Applicant: Shenzhen China Star Optoelectronics Technology Co., Ltd., Shenzhen, Guangdong (CN)

(72) Inventor: Qiuping Huang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 234 days.

(21) Appl. No.: 14/426,425

(22) PCT Filed: Dec. 2, 2014

(86) PCT No.: PCT/CN2014/092829
§ 371 (c)(1),
(2) Date: Mar. 6, 2015

(87) PCT Pub. No.: WO2016/082234
PCT Pub. Date: Jun. 2, 2016

(65) Prior Publication Data
US 2016/0343742 A1 Nov. 24, 2016

(30) Foreign Application Priority Data
Nov. 24, 2014 (CN) .......................... 2014 1 0682972

(51) Int. Cl.
*H01L 29/66* (2006.01)
*H01L 29/786* (2006.01)
(Continued)

(52) U.S. Cl.
CPC ........ *H01L 27/2418* (2013.01); *G02F 1/1368* (2013.01); *G02F 1/136209* (2013.01);
(Continued)

(58) Field of Classification Search
CPC ...... H01L 29/4908; H01L 29/66742–29/6678; H01L 29/786–29/78696;
(Continued)

(56) References Cited

U.S. PATENT DOCUMENTS 5,414,276 A * 5/1995 McCarthy ........... H01L 21/2007
257/57
6,278,504 B1 8/2001 Sung
(Continued)

FOREIGN PATENT DOCUMENTS

CN 101452135 A 6/2009
CN 103268855 A 8/2013
(Continued)

*Primary Examiner* — Mary Wilczewski
*Assistant Examiner* — Tsz Chiu
(74) *Attorney, Agent, or Firm* — Andrew C. Cheng

(57) ABSTRACT

A thin-film transistor includes a substrate, a gate electrode formed on a surface of the substrate, a gate protection layer and a semiconductor layer stacked on the gate electrode, and an etch stop layer, source terminal metal, and drain terminal metal formed on a surface of the semiconductor layer in such a way that the source terminal metal and the drain terminal metal are respectively located on two opposite sides of the etch stop layer. The thin-film transistor further includes a light shielding layer, an insulation medium layer, and a pixel electrode. The light shielding layer is stacked on the etch stop layer to prevent light from irradiating the semiconductor layer. The insulation medium layer covers the source terminal metal, the drain terminal metal, and the light shielding layer. The pixel electrode is formed on a surface of the insulation medium layer and electrically connected to the drain terminal metal.

8 Claims, 2 Drawing Sheets

(51) Int. Cl.
*H01L 27/24* (2006.01)
*G02F 1/1362* (2006.01)
*G02F 1/1368* (2006.01)
*H01L 27/12* (2006.01)
H01L 21/20 (2006.01)
H01L 21/70 (2006.01)
H01L 21/84 (2006.01)

(52) U.S. Cl.
CPC ...... *G02F 1/136286* (2013.01); *H01L 27/124* (2013.01); *H01L 29/66742* (2013.01); *H01L 29/786* (2013.01); *H01L 29/7869* (2013.01); *H01L 29/78669* (2013.01); *H01L 29/78678* (2013.01)

(58) Field of Classification Search
CPC .......... H01L 27/12–27/13; H01L 2924/13069; H01L 51/0508–51/057; H01L 29/6675–29/66765; H01L 29/78663–29/78669; H01L 29/78672–29/28678; H01L 29/78654–29/78657; H01L 29/7863; H01L 29/42392; H01L 29/66265; H01L 29/66772; H01L 29/7317; H01L 29/78633; H01L 29/78645; H01L 29/78648; H01L 29/73217
See application file for complete search history.

(56) References Cited

U.S. PATENT DOCUMENTS

| | | | |
|---|---|---|---|
| 2007/0090365 A1* | 4/2007 | Hayashi | H01L 29/7869 257/72 |
| 2008/0283840 A1 | 11/2008 | Doi et al. | |
| 2011/0127531 A1* | 6/2011 | Kim | H01L 29/41733 257/59 |
| 2013/0242220 A1 | 9/2013 | Chang et al. | |

FOREIGN PATENT DOCUMENTS

| | | |
|---|---|---|
| CN | 103314446 A | 9/2013 |
| CN | 103681693 A | 3/2014 |
| CN | 103855225 A | 6/2014 |
| JP | H09199728 A | 7/1997 |

* cited by examiner

THIN-FILM TRANSISTOR, DISPLAY DEVICE, AND METHOD FOR MANUFACTURING THIN-FILM TRANSISTOR

CROSS REFERENCE TO RELATED APPLICATIONS

This application claims the priority of Chinese Patent Application No. 201410682972.3, entitled "Thin-Film Transistor, Display Device, and Method for Manufacturing Thin-Film Transistor", filed on Nov. 24, 2014, the disclosure of which is incorporated herein by reference in its entirety.

BACKGROUND OF THE INVENTION

1. Field of the Invention

The present invention relates to the field of liquid crystal displaying, and in particular to a thin-film transistor (TFT), a display device, and a method for manufacturing a thin-film transistor.

2. The Related Arts

Currently, techniques that use oxide semiconductor to make a semiconductor layer of a thin-film transistor are advanced techniques. Since an oxide semiconductor TFT has high mobility and high visible light transparency, such a device is being widely used in liquid crystal display devices.

The conventional TFTs are suffering fluctuation of threshold value of the TFTs due to irradiation of light on the semiconductor layer of the TFTs. The absorption of the incident light causes variation of electrical conductivity and change of the threshold value of the TFTs, thereby leading to lowered reliability of the liquid crystal display panels.

SUMMARY OF THE INVENTION

The present invention provides a thin-film transistor (TFT), a display device, and a method for manufacturing a TFT, which achieve light-shielding protection of a TFT and also reduce operation steps.

To achieve the above object, embodiments of the present invention provide the following technical solutions:

The present invention provides a thin-film transistor, which comprises a substrate, a gate electrode formed on a surface of the substrate, a gate protection layer and a semiconductor layer stacked on the gate electrode, and an etch stop layer, source terminal metal, and drain terminal metal formed on a surface of the semiconductor layer in such a way that the source terminal metal and the drain terminal metal are respectively located on two opposite sides of the etch stop layer. The thin-film transistor further comprises a light shielding layer, an insulation medium layer, and a pixel electrode. The light shielding layer is stacked on the etch stop layer to prevent light from irradiating the semiconductor layer. The insulation medium layer covers the source terminal metal, the drain terminal metal, and the light shielding layer. The pixel electrode is formed on a surface of the insulation medium layer and electrically connected to the drain terminal metal.

In the thin-film transistor described above, the light shielding layer comprises an organic black substance having the properties of non-light-transmitting and non-electrically-conductive.

In the thin-film transistor described above, the light shielding layer comprises black negative photoresist.

In the thin-film transistor described above, the light shielding layer is made of a BM material.

The present invention also provides a display device. The display device comprises a thin-film transistor described each of the above descriptions.

The present invention further provides a method for manufacturing a thin-film transistor, which comprises the following steps:

providing a substrate and depositing a gate electrode on the substrate;

depositing a gate protection layer on a surface of the substrate that comprises the gate electrode formed thereon;

forming a semiconductor layer on a surface of the gate protection layer;

depositing an etch stop layer on a surface of the semiconductor layer;

forming a light shielding layer on a surface of the etch stop layer;

depositing source terminal metal and the drain terminal metal in such a way that the source terminal metal and the drain terminal metal are set on the surface of the semiconductor layer and are respectively located on opposite sides of the etch stop layer;

depositing an insulation medium layer in such a way that the insulation medium layer covers the source terminal metal, the drain terminal metal, and the light shielding layer; and forming a pixel electrode in such a way that the pixel electrode is set on a surface of the insulation medium layer and is electrically connected to the drain terminal metal.

In the method described above, the light shielding layer comprises an organic black substance having the properties of non-light-transmitting and non-electrically-conductive.

In the method described above, the light shielding layer comprises black negative photoresist and a photolithographic operation is applied to the light shielding layer is such a way that formations of a pattern of the etch stop layer and a pattern of the light shielding layer are achieved in the same photolithographic process.

In the method described above, the step of "forming a light shielding layer on a surface of the etch stop layer" comprises:

coating a layer of photoresist on a surface of the deposited etch stop layer, where the photoresist is negative photoresist having a property of shielding light; and in combination with a design of a mask, applying the photolithographic operation to form a photoresist pattern that forms a pattern of the light shielding layer and a pattern of the etch stop layer.

In the method described above, the photolithographic operation is applicable through a design of mask for half-tone or gray-tone photolithographic operation, allowing for adjustment of the thickness of the light shielding layer.

The present invention provides a light shielding layer on a surface of an etch stop layer to allow a conductive zone of a thin-film transistor according to the present invention to be covered by the light shielding layer that is non-light-transmitting so that the light shielding layer protects the semiconductor layer of the transistor from being irradiated by light thereby avoiding threshold fluctuation of the thin-film transistor caused by being irradiated by light and thus improving the reliability of the display device.

BRIEF DESCRIPTION OF THE DRAWINGS

To more clearly explain the technical solution proposed in the present invention, a brief description of the drawings that are necessary for describing embodiments is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to a technical solution proposed in an embodiment of the present invention with reference to the attached drawings of the embodiment of the present invention.

Figure 1:
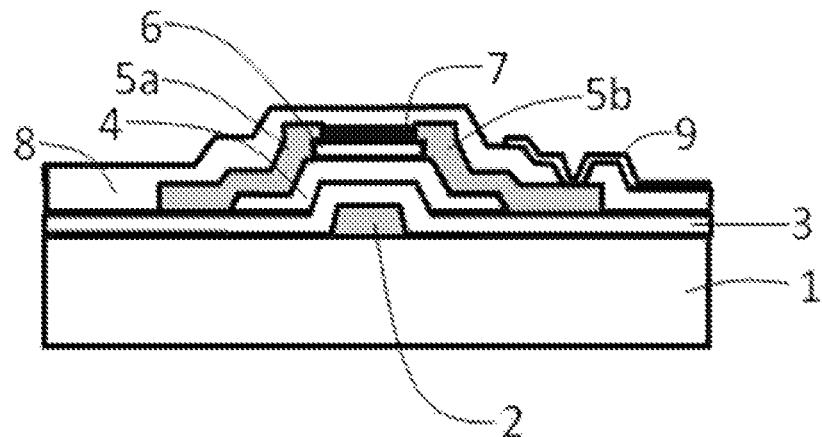
FIG. 1 is a schematic view showing a thin-film transistor (TFT) according to an embodiment of the present invention.

FIG. 1 shows a thin-film transistor (TFT) provided in the present invention. The thin-film transistor comprises a substrate 1, a gate electrode 2 formed on a surface of the substrate 1, a gate protection layer 3 and a semiconductor layer 4 (namely the channel layer) stacked on the gate electrode 2, and an etch stop layer 6, source terminal metal 5a, and drain terminal metal 5b formed on a surface of the semiconductor layer 4 in such a way that the source terminal metal 5a and the drain terminal metal 5b are respectively located on two opposite sides of the etch stop layer 6. In the instant embodiment, the substrate 1 is a transparent glass substrate. The gate electrode 2 is formed through deposition of metal on the substrate 1 and is made of a material selected from one of copper, tungsten, chromium, aluminum, and combinations thereof. In one embodiment, the etch stop layer comprises SiO2 that functions to protect the semiconductor layer 4.

The thin-film transistor further comprises a light shielding layer 7, an insulation medium layer 8, and a pixel electrode 9. The light shielding layer 7 is stacked on the etch stop layer 6 to prevent light from irradiating the semiconductor layer 4. The insulation medium layer 8 covers the source terminal metal 5a, the drain terminal metal 5b, and the light shielding layer 7. The pixel electrode 9 is formed on a surface of the insulation medium layer 8 and is electrically connected to the drain terminal metal 5b. The insulation medium layer 8 comprises a via formed therein and the pixel electrode 9 extends, partly, into the via to achieve electrical connection of the pixel electrode 9 to the drain terminal metal 5b.

Specifically, the light shielding layer 7 comprises an organic black substance having the properties of non-light-transmitting and non-electrically-conductive.

The light shielding layer 7 is preferably a black negative photoresist. In one embodiment, the light shielding layer 7 is made of material of a BM (Black Matrix) material.

The present invention also provides a display device. The display device comprises the thin-film transistor described above.

The present invention provides a light shielding layer 7 on a surface of an etch stop layer 6 to allow a conductive zone of a thin-film transistor according to the present invention to be covered by the light shielding layer 7 that is non-light-transmitting so that the light shielding layer 7 protects the semiconductor layer 4 of the transistor from being irradiated by light thereby avoiding threshold fluctuation of the thin-film transistor caused by being irradiated by light and thus improving the reliability of the display device.

Figure 2:
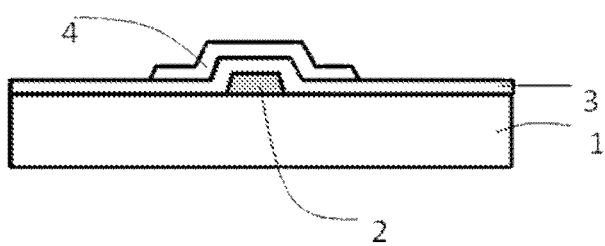
FIG. 2 is a schematic view illustrating deposition of a gate electrode, a gate protection layer, and a semiconductor layer on a substrate in a process of manufacturing the TFT shown in FIG. 1.

The present invention also provides a method for manufacturing a thin-film transistor. The method for manufacturing a thin-film transistor comprises the following steps:

Referring to FIG. 2, a substrate 1 is provided. In the instant embodiment, the substrate 1 is a transparent glass substrate. A gate electrode 2 is deposited on the substrate 1. As shown in FIG. 2, the gate electrode 2 is formed at a middle portion of a surface of the substrate 1. The gate electrode 2 is made of a material selected from one of copper, tungsten, chromium, aluminum, and combinations thereof. A gate protection layer 3 is deposited on the surface of the substrate 1 on which the gate electrode 2 is formed. A semiconductor layer 4 is formed on a surface of the gate protection layer 3 in such a way that the semiconductor layer 4 is located exactly above the gate electrode 2.

Figure 3:
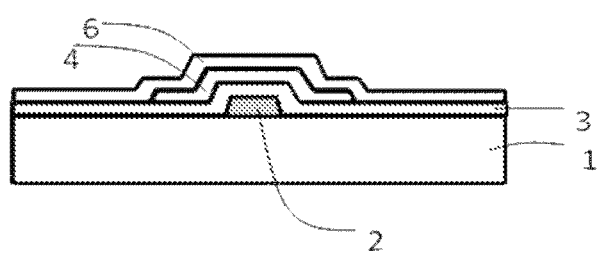
FIG. 3 is a schematic view illustrating deposition of an etch stop layer, on the basis illustrated in FIG. 2, in the process of manufacturing the TFT shown in FIG. 1.

Referring to FIG. 3, an etch stop layer 6 is deposited on a surface of the semiconductor layer 4.

Figure 4:
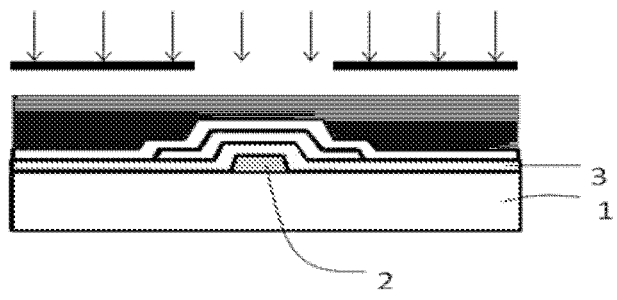
FIG. 4 is a schematic view illustrating coating a layer of photoresist and performing a photolithographic operation, on the basis illustrated in FIG. 3, in the process of manufacturing the TFT shown in FIG. 1.
Figure 5:
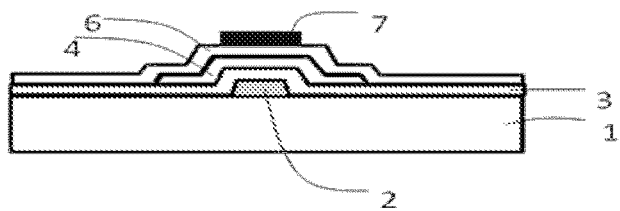
FIG. 5 is a schematic view illustrating formation of a pattern of a light shielding layer with the photolithographic operation, on the basis illustrated in FIG. 4.
Figure 6:
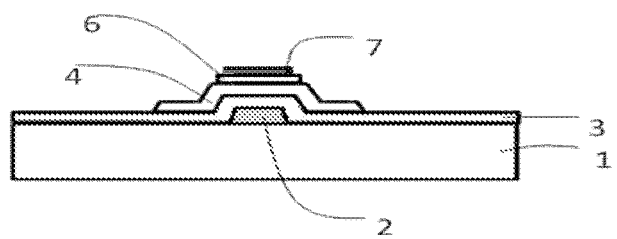
FIG. 6 is a schematic view illustrating formation of a pattern of the etch stop layer through etching, on the basis illustrated in FIG. 5.

Referring to FIGS. 4, 5, and 6, a light shielding layer 7 is formed on a surface of the etch stop layer 6.

Source terminal metal 5a and drain terminal metal 5b are then deposited in such a way that the source terminal metal 5a and the drain terminal metal 5b are set on a surface of the semiconductor layer 4 and are respectively located on two opposite sides of the etch stop layer 6. Deposition of the source terminal metal 5a and the drain terminal metal 5b is achieved with a process that is similar to one adopted in the known techniques and further details will not be given. Then, an insulation medium layer 8 is deposited in such a way that the insulation medium layer 8 covers the source terminal metal 5a, the drain terminal metal 5b, and the light shielding layer 7. Finally, a pixel electrode 9 is formed in such a way that the pixel electrode 9 is located on a surface of the insulation medium layer 8 and is electrically connected to the drain terminal metal 5b. Before the pixel electrode 9 is formed, a via is first formed in the insulation medium layer 8 and then, the layer of the pixel electrode 9 is deposited to have the pixel electrode 9 extend into the via to electrically engage the drain terminal metal 5b.

Specifically, the light shielding layer 7 comprises an organic black substance having the properties of non-light-transmitting and non-electrically-conductive. The light shielding layer 7 can be a black negative photoresist. By applying a photolithographic operation to the light shielding layer 7, a pattern of the etch stop layer 6 and a pattern of the light shielding layer 7 can be form in the same photolithographic process. This saves one individual photolithographic operation for the semiconductor layer 4 and at the same time achieves light shielding and protection of the device.

In one embodiment, referring to FIGS. 4-6, the step of "a light shielding layer 7 is formed on a surface of the etch stop layer 6" comprises: coating a layer of photoresist on a surface of the deposited etch stop layer 6, where the photoresist is negative photoresist having a property of shielding light that is similar to the light shielding property of a black matrix (BM) (a black light shielding layer 7). In combination with a design of a mask, the application of a photolithographic operation to form a photoresist pattern would form a pattern of the light shielding layer 7 and a pattern of the etch stop layer 6.

The photolithographic operation adopted is applicable through a design of mask for half-tone or gray-tone photolithographic operation, allowing for adjustment of the thickness of the light shielding layer 7 to thereby provide a light shielding layer 7 of a suitable thickness.

Disclosed above is preferred embodiments of the present invention. It is appreciated that those having ordinary skills of the art may readily appreciate that various improvements and modifications without departing the principle of the present invention. These improvements and modifications are considered within the protection scope covered by the present invention.

What is claimed is:

1. A thin-film transistor, comprising a substrate, a gate electrode formed on a surface of the substrate, a gate protection layer and a semiconductor layer stacked on the gate electrode, and an etch stop layer, source terminal metal, and drain terminal metal formed on a surface of the semiconductor layer in such a way that the source terminal metal and the drain terminal metal are respectively located on two opposite sides of the etch stop layer, wherein the thin-film transistor further comprises a light shielding layer, an insulation medium layer, and a pixel electrode, the light shielding layer being stacked on the etch stop layer to prevent light from irradiating the semiconductor layer, the insulation medium layer covering the source terminal metal, the drain terminal metal, and the light shielding layer, the pixel electrode being formed on a surface of the insulation medium layer and electrically connected to the drain terminal metal;

wherein the source terminal metal and the drain terminal metal that are respectively located on two opposite sides of the etch stop layer have parts that face each other and are spaced from each other and wherein the light shielding layer is located between the parts of the source terminal metal and the drain terminal metal and is delimited, at two opposite sides thereof, by the parts of the source terminal metal and the drain terminal metal and wherein the light shielding layer that is stacked on the etch stop layer such that the stacked light shielding layer and etch stop layer are both located between the parts of the source terminal metal and the drain terminal metal and the light shielding layer and the etch stop layer both have two opposite ends respectively corresponding to each other and in direct contact with the parts of the source terminal metal and the drain terminal metal, such that the two opposite ends of the etch stop layer are respectively covered by the source terminal and the drain terminal and the two opposite ends of the light shielding layer are respectively covered by the source terminal and the drain terminal.

2. The thin-film transistor as claimed in claim 1, wherein the light shielding layer comprises an organic black substance having the properties of non-light-transmitting and non-electrically-conductive.

3. The thin-film transistor as claimed in claim 2, wherein the light shielding layer comprises black negative photoresist.

4. The thin-film transistor as claimed in claim 3, wherein the light shielding layer is made of a black matrix material.

5. A display device, comprising a thin-film transistor, wherein the thin-film transistor comprises a substrate, a gate electrode formed on a surface of the substrate, a gate protection layer and a semiconductor layer stacked on the gate electrode, and an etch stop layer, source terminal metal, and drain terminal metal formed on a surface of the semiconductor layer in such a way that the source terminal metal and the drain terminal metal are respectively located on two opposite sides of the etch stop layer, the thin-film transistor further comprising a light shielding layer, an insulation medium layer, and a pixel electrode, the light shielding layer being stacked on the etch stop layer to prevent light from irradiating the semiconductor layer, the insulation medium layer covering the source terminal metal, the drain terminal metal, and the light shielding layer, the pixel electrode being formed on a surface of the insulation medium layer and electrically connected to the drain terminal metal;

wherein the source terminal metal and the drain terminal metal that are respectively located on two opposite sides of the etch stop layer have parts that face each other and are spaced from each other and wherein the light shielding layer is located between the parts of the source terminal metal and the drain terminal metal and is delimited, at two opposite sides thereof, by the parts of the source terminal metal and the drain terminal metal and wherein the light shielding layer that is stacked on the etch stop layer such that the stacked light shielding layer and etch stop layer are both located between the parts of the source terminal metal and the drain terminal metal and the light shielding layer and the etch stop layer both have two ends respectively corresponding to each other and in direct contact with the parts of the source terminal metal and the drain terminal metal, such that the two opposite ends of the etch stop layer are respectively covered by the source terminal and the drain terminal and the two opposite ends of the light shielding layer are respectively covered by the source terminal and the drain terminal.

6. The display device as claimed in claim 5, wherein the light shielding layer comprises an organic black substance having the properties of non-light-transmitting and non-electrically-conductive.

7. The display device as claimed in claim 6, wherein the light shielding layer comprises black negative photoresist.

8. The display device as claimed in claim 7, wherein the light shielding layer is made of a black matrix material.

* * * * *